(12) United States Patent
Tsai et al.

(10) Patent No.: US 7,884,471 B2
(45) Date of Patent: Feb. 8, 2011

(54) SOLDER BUMP AND RELATED INTERMEDIATE STRUCTURE HAVING PRIMARY AND SECONDARY PORTIONS AND METHOD OF MANUFACTURING SAME

(75) Inventors: Yu-Ying Tsai, Taipei (TW); Shih-Ming Chen, Miaoli County (TW); Kuo-Wei Lin, Shinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 331 days.

(21) Appl. No.: 11/306,015

(22) Filed: Dec. 14, 2005

(65) Prior Publication Data
US 2006/0199300 A1    Sep. 7, 2006

Related U.S. Application Data

(62) Division of application No. 10/928,612, filed on Aug. 27, 2004, now Pat. No. 6,977,213.

(51) Int. Cl.
    *H01L 29/40*   (2006.01)
(52) U.S. Cl. .......... 257/737; 257/738; 257/778
(58) Field of Classification Search .......... 257/737, 257/738, 778
    See application file for complete search history.

(56) References Cited

U.S. PATENT DOCUMENTS

| | | | | |
|---|---|---|---|---|
| 5,542,601 A * | 8/1996 | Fallon et al. | | 228/119 |
| 5,611,481 A * | 3/1997 | Akamatsu et al. | | 228/180.22 |
| 5,641,113 A * | 6/1997 | Somaki et al. | | 228/180.22 |
| 5,748,450 A * | 5/1998 | Kim et al. | | 361/777 |
| 5,767,580 A * | 6/1998 | Rostoker | | 257/737 |
| 5,892,179 A | 4/1999 | Rinne et al. | | |
| 6,196,443 B1 * | 3/2001 | DiGiacomo | | 228/180.22 |
| 6,214,642 B1 * | 4/2001 | Chen et al. | | 438/108 |
| 6,225,206 B1 * | 5/2001 | Jimarez et al. | | 438/616 |
| 6,281,581 B1 * | 8/2001 | Desai et al. | | 257/737 |
| 6,300,250 B1 | 10/2001 | Tsai | | |
| 6,372,545 B1 | 4/2002 | Fan et al. | | |
| 6,426,281 B1 | 7/2002 | Lin et al. | | |
| 6,426,283 B1 | 7/2002 | Chen et al. | | |
| 6,486,054 B1 | 11/2002 | Fan et al. | | |
| 6,541,366 B1 | 4/2003 | Chin et al. | | |
| 6,551,856 B1 | 4/2003 | Lee | | |
| 6,583,039 B2 | 6/2003 | Chen et al. | | |

(Continued)

FOREIGN PATENT DOCUMENTS

CN    1183169    5/1998

*Primary Examiner*—Matthew C Landau
*Assistant Examiner*—James M Mitchell
(74) *Attorney, Agent, or Firm*—Baker & McKenzie LLP

(57) ABSTRACT

Disclosed herein are intermediate and solder bump structures. In one embodiment, a structure comprises a primary solder column comprising primary solder material and configured to electrically contact a bonding pad on a semiconductor substrate. The structure also comprises at least one secondary solder column comprising secondary solder material in electrical contact with the primary solder column, the at least one secondary column having a height and volume less than a height and volume of the primary solder column. In such structures, the primary solder column is further configured to form a primary solder bump comprising the primary solder material and at least a portion of the secondary solder material through cohesion from the at least one secondary solder column when the intermediate structure undergoes a reflow process.

20 Claims, 6 Drawing Sheets

U.S. PATENT DOCUMENTS

| | | |
|---|---|---|
| 6,586,322 B1 | 7/2003 | Chiu et al. |
| 6,605,524 B1 | 8/2003 | Fan et al. |
| 6,649,507 B1 | 11/2003 | Chen et al. |
| 6,858,111 B2 * | 2/2005 | Perry et al. .................. 156/327 |
| 7,045,893 B1 * | 5/2006 | Paek et al. .................. 257/737 |
| 7,126,211 B2 * | 10/2006 | Yang .......................... 257/678 |
| 2001/0040290 A1 * | 11/2001 | Sakurai et al. ............. 257/737 |
| 2002/0121709 A1 * | 9/2002 | Matsuki et al. ............ 257/786 |
| 2002/0127836 A1 | 9/2002 | Lin et al. |
| 2002/0149118 A1 * | 10/2002 | Yamaguchi et al. ......... 257/778 |
| 2003/0011077 A1 * | 1/2003 | Morishima et al. .......... 257/778 |
| 2003/0073036 A1 | 4/2003 | Peng et al. |
| 2003/0129822 A1 * | 7/2003 | Lee et al. .................... 438/613 |
| 2004/0005771 A1 | 1/2004 | Fan et al. |
| 2004/0099950 A1 * | 5/2004 | Ohsumi ...................... 257/738 |
| 2004/0222520 A1 * | 11/2004 | Jin .............................. 257/737 |
| 2004/0227256 A1 * | 11/2004 | Seko ........................... 257/784 |
| 2006/0046434 A1 * | 3/2006 | Su et al. ..................... 438/460 |

* cited by examiner

US 7,884,471 B2

SOLDER BUMP AND RELATED INTERMEDIATE STRUCTURE HAVING PRIMARY AND SECONDARY PORTIONS AND METHOD OF MANUFACTURING SAME

CROSS-REFERENCE TO RELATED APPLICATION

This application is a Divisional Application of U.S. application Ser. No. 10/928,612, filed on Aug. 27, 2004, entitled "IC CHIP SOLDER BUMP STRUCTURE AND METHOD OF MANUFACTURING SAME" commonly assigned with the present application and incorporated herein by reference in its entirety for all purposes.

TECHNICAL FIELD

Disclosed embodiments herein relate generally to solder bumps for providing electrical and mechanical bonds between substrates, and more particularly to an intermediate IC chip solder bump structure, a finished IC chip solder bump structure, and method of manufacturing the same.

BACKGROUND

The packaging of integrated circuit (IC) chips is one of the most important steps in the manufacturing process, contributing significantly to the overall cost, performance and reliability of the packaged chip. As semiconductor devices reach higher levels of integration, packaging technologies, such as chip bonding, have become critical. Packaging of the IC chip accounts for a considerable portion of the cost of producing the device and failure of the package leads to costly yield reduction.

As semiconductor device sizes have decreased, the density of devices on a chip has increased, along with the size of the chip, thereby making chip bonding more challenging. One of the major problems leading to package failure as chip sizes increase is the increasingly difficult problem of thermal coefficient of expansion (TCE) mismatches between materials leading to stress buildup and consequent failure. For example, in flip-chip technology chip bonding is accomplished by means of solder bumps formed on under bump metallization (UBM) layers overlying an IC chip bonding pad where, frequently, improper wetting (bonding) between the solder and UBM layers may lead to a bond not sufficiently strong to withstand such stresses.

In many cases it is necessary to repackage the chip after a package failure, requiring costly detachment of the chip from the package and repeating the chip bonding process in a new package. Some chip bonding technologies use a solder bump attached to a contact pad (the bonding pad) on the chip to make an electrical (and somewhat structural) connection from the chip devices to the package substrate. For example, C4 (Controlled-Collapse Chip Connection) is a means of connecting semiconductor chips to substrates in electronic packages. C4 is a flip-chip technology in which the interconnections are small solder balls (bumps) on the chip bonding pads. Since the solder balls form an area array (a "ball grid array" (BGA)), C4 technology can achieve a very high-density scheme for chip interconnections. The flip-chip method has the advantage of achieving a very high density of interconnection to the device with a very low parasitic inductance.

Solder bumps may be formed by, for example, vapor deposition of solder material over layers of under bump metallization (UBM) layers formed on the bonding pad. In another method, the layers of solder material may deposited by electro-deposition onto a seed layer material deposited over UBM layers formed on the bonding pad. In yet another method, solder bumps may be formed by a solder-paste screen-printing method using a mask (stencil) to guide the placement of the solder-paste. Typically, after deposition of the solder materials, for example, in layers or as a homogeneous mixture, the solder bump (ball) is formed after removing a photoresist mask defining the solder material location by heating the solder material to a melting point (a "reflow" process) such that a solder ball is formed with the aid of surface tension. Alternatively, a solder bump may be formed within a permanent mask made of photoresist or some other organic resinous material defining the solder bump area over the bonding pad. Because of the importance of the solder bumps/balls in such flip-chip techniques, improvements in processes used to form the solder balls on the IC chips are continuously being pursued.

SUMMARY

Disclosed herein is a method of manufacturing a solder bump on a semiconductor device. In one embodiment, the method includes creating a bonding pad over a semiconductor substrate, and placing a mask layer over the substrate and the bonding pad. The method also includes forming an opening in the mask layer having a primary solder mold and at least one secondary solder mold joined with the primary mold, where the opening exposes a portion of the bonding pad. In this embodiment, the method further includes filling the primary solder mold and the at least one secondary solder mold with solder material to form corresponding primary and at least one secondary solder columns in electrical contact with the bonding pad. The method also includes removing the mask layer after the filling of the solder molds with the solder material. The method still further includes reflowing the solder material to form a primary solder bump from the solder material of the primary solder column and at least a portion of the solder material from the at least one secondary solder column through cohesion of the solder material from the at least one secondary solder column to the primary solder column when melted.

In another aspect, a solder bump structure is disclosed that is formed on a bonding pad of a first substrate for electrically and mechanically coupling the first substrate to a bonding pad of a second substrate. In one embodiment, the structure includes a primary solder bump comprising a volume of solder material and having a first height and a base perimeter defined by a nadir. In addition, in this embodiment, the solder bump structure further includes at least one secondary solder bump comprising a volume of solder material having a second height less than the first height, the secondary solder bump adjacent the primary solder bump and metallurgically adjoined thereto at the nadir.

In yet another aspect, an intermediate structure is disclosed. In one embodiment, the intermediate structure includes a primary solder column comprising primary solder material and configured to electrically contact a bonding pad on a semiconductor substrate. Also in this embodiment, the intermediate structure includes at least one secondary solder column comprising secondary solder material in electrical contact with the primary solder column, where the at least one secondary column has a height and volume less than a height and volume of the primary solder column. In addition, in this embodiment, the primary solder column is further configured to form a primary solder bump comprising the primary solder material and at least a portion of the secondary solder material through cohesion from the at least one secondary solder column when the intermediate structure undergoes a reflow process.

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION

Figure 1A:
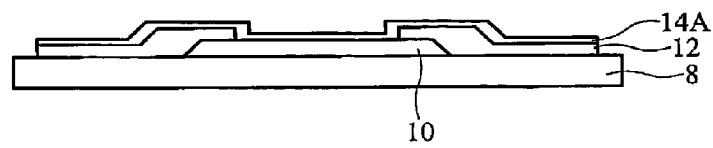
FIGS. 1A-1E illustrate an exemplary conventional process for forming a solder bump on a semiconductor chip shown through cross section views of a IC chip bonding pad area.
Figure 1B:
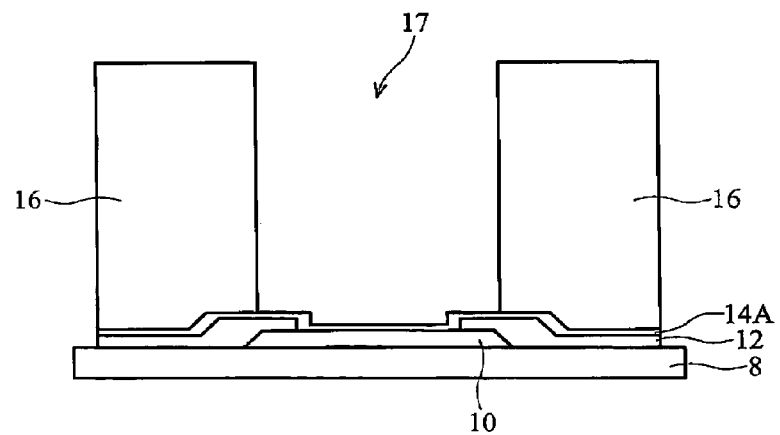
Figure 1C:
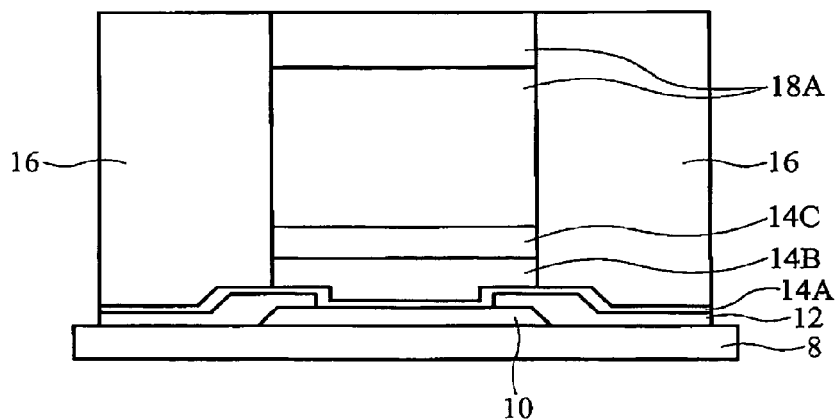

Referring initially to FIGS. 1A-1E, illustrated is an exemplary conventional process for forming a solder bump on a semiconductor chip shown through cross section views of an IC chip bonding pad area. With reference to FIG. 1A, the process of creating the solder bumps begins after the chip bonding pad 10, for example, Cu or Al formed by vapor deposition, has been formed on the surface of a semiconductor wafer 8. After the bonding pad 10 is formed, a passivation layer 12 of, for example, silicon dioxide ($SiO_2$) is formed over the semiconductor device surface excluding a portion overlying the bonding pad 10. Typically, one or more under-bump metallization (UBM) layers, e.g., layer 14A, of from about 500 Å to about 5000 Å are then deposited over chip bonding pad 10 and a layer of photoresist 16 formed thereover, as shown in FIG. 1B.

The UBM layer 14A may be, for example, a layer of titanium. The photoresist layer 16 is typically from about 10 to about 25 microns high. As shown in FIG. 1B, the photoresist layer 16 is photolithographically patterned and developed to form an opening 17 above the bonding pad 10 to expose a UBM layer, e.g., 14A. Additional UBM layers may be formed within the mask opening 17 by, for example, an electroplating process or vapor deposition process forming, for instance, UBM layers 14B and 14C in FIG. 1C. Layers 14B and 14C may be, for example, layers of copper and nickel, respectively. UBM layers are typically formed over the bonding pad 10 to allow for better bonding and wetting of the solder material to the uppermost UBM layer 14C adjacent to the solder material, and for protection of the bonding pad 10 by the lowermost UBM layer 14A. A column of solder material 18A may either be deposited in layers, for example, a layer of lead followed by a layer of tin, where the solder material layers are later formed into a homogeneous solder during a reflow (e.g., temporary melting) process for solder material. In other embodiments, the solder material may be deposited as a homogeneous solder material by vapor deposition or electroplating onto a "seed layer," such as UBM layer 14C.

Figure 1D:
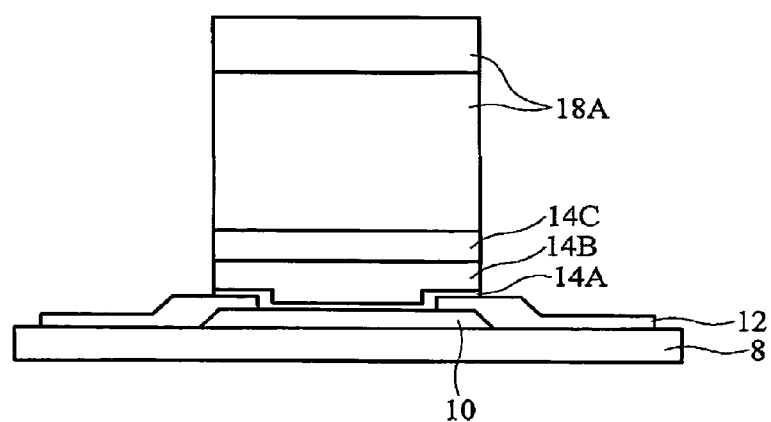
Figure 1E:
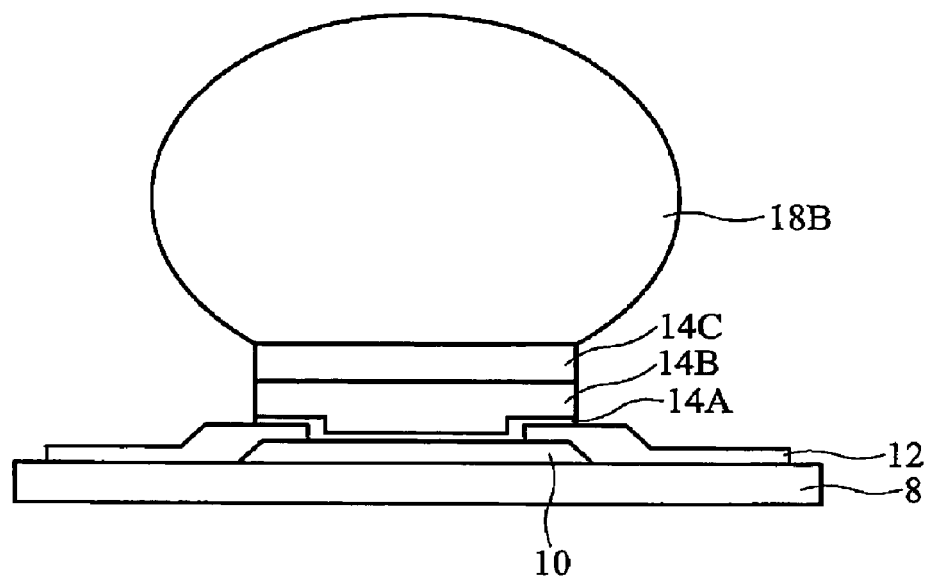

Looking at FIG. 1D, after removal of the photoresist layer 16, the UBM layer 14A is etched through by an etching process, such as a reactive ion etch (RIE) process, to the underlying passivation layer 12 using the solder column 18A as an etching mask to protect the underlying UBM layers 14A, 14B, and 14C. The solder column 18 is then temporarily heated to a melting point ("reflow") to form a solder bump 18B over the UBM layer 14C, as shown in FIG. 1E. After the reflow process, a homogeneous lead/tin solder bump is formed, for example, with composition ratios indicating weight percent, high lead alloys including 95 Pb/5 Sn (95/5) or 90 Pb/10 Sn (95/10) with melting temperatures in excess of 300° C. or eutectic 63 Pb/37 Sn (63/37) with a melting temperature of 183° C. The resulting solder bump 18B is composed of a homogeneous material and has a well-defined melting temperature. For example, the high melting Pb/Sn alloys are reliable bump metallurgies that are particularly resistant to material fatigue.

A series of layers may be advantageously used to form the UBM layers. The uppermost UBM layer adjacent the solder bump supplies a wettable layer during reflow for the solder bump subsequently formed over the layers. For example, to form the plurality of UBM layers, some UBM systems may include, reciting the lowermost layer adjacent the bonding pad 10 first, chromium and copper (Cr/Cu), titanium and copper (Ti/Cu), and titanium-tungsten and copper (Ti:W/Cu), and titanium, copper, nickel (Ti/Cu/Ni). Since conventional bumps melt completely in the reflow soldering process of the flip-chip bonding technique to intimately contact the UBM layer, the UBM layer must be able to withstand thermal and mechanical stresses, and resist intermetallic phase formations. Thus, the quality of the UBM layers and wettability during reflow is critical to the reliability of the complete assembly. In addition, the UBM layers help define the size of the solder bump 18B after reflow, and provide a surface that is wettable by the solder and that reacts with the solder to provide an adhesion bond with mechanical integrity and thereby acceptable reliability under mechanical and heat stresses. Furthermore, the UBM layers act as a barrier between the semiconductor device and the metals in the interconnections.

Figure 2A:
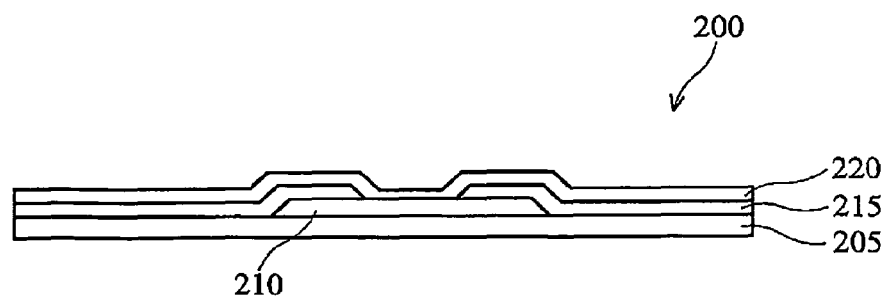
FIGS. 2A-2F illustrate one embodiment of an exemplary process for forming older bump on a semiconductor chip in accordance with the disclosed principles.

Turning now to FIGS. 2A-2F, illustrated is one embodiment of an exemplary process for forming a solder bump on a semiconductor chip in accordance with the disclosed principles. Looking first at FIG. 2A, illustrated is a solder bump area 200 early in the process for forming a solder bump to provide an electrical, and mechanical, bond between an IC chip and another component such as a printed circuit board. As shown, a typical solder bump area 200 includes a semiconductor substrate 205 with a bonding pad 210 formed on a portion thereof. Also often included is a passivation layer 215 typically constructed from dielectric material. If a passivation layer 215 is included, a portion of the layer 215 over the bonding pad 210 is removed, perhaps using conventional etching techniques, to expose a part of the bonding pad 210. One or more UBM layers 220 may then be formed over the passivation layer 215 and in electrical contact with the bonding pad 210. Although not required, a UBM layer 220, provides a larger footprint on which to form the solder bump, and often using materials, such as titanium, that provide a stronger bond with the solder bump when formed.

Figure 2B:
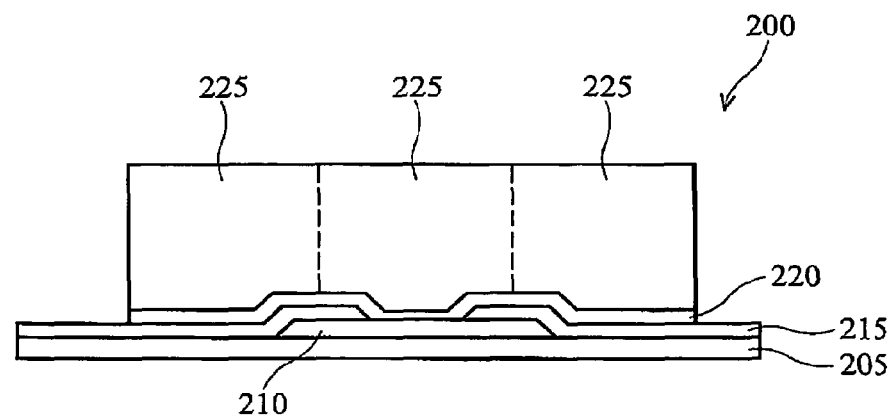

Referring now to FIG. 2B, the same solder bump area 200 discussed above is shown, a little further into the bump formation process. Specifically, a masking layer 225 is placed over the surface of the solder bump area 200 so that certain portions of layers in the area may be removed, while others will remain. In an advantageous embodiment, the mask layer is a photoresist layer 225 that has been deposited over the solder bump area 200. The photoresist layer 225 is then patterned and developed, typically using conventional photolithography techniques. The portions of the solder bump area 200 no longer masked by the photoresist layer 215 may then be removed, usually through etching. In the illustrated embodiment, a width of the UBM layer 220 is defined using the photoresist layer 225 and etching process.

Figure 2C:
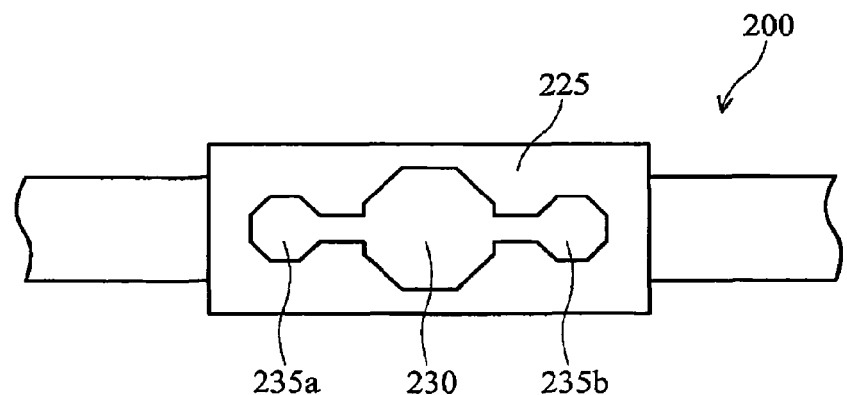

Turning now to FIG. 2C, a top view of a different pattern is illustrated in the photoresist layer 225, although in alternative embodiments this may be a different photoresist layer 225 than the layer illustrated in FIG. 2B. As shown, the photoresist layer 225 is patterned and developed so as to create distinct, but interconnected, openings (or "molds") to be filled with solder material later in the manufacturing process. More specifically, a primary solder mold 230 is formed in the photoresist layer 225 proximate to the center of the solder bump area 200, typically immediately over the actual bonding pad 210 (and UBM layer 220, if present). Adjacent to the primary solder mold 230, two secondary solder molds 235a, 235b are also formed in the photoresist layer 225. These secondary molds 235a, 235b may be beneficially formed near the outer edges of the defined UBM layer 220, and will also be filled with solder material later in the manufacturing process. While the illustrated embodiment shows molds 230, 235a, 235b having an octagonal shape, other various shapes, including circular or teardrop, may also be employed without departing from the broad scope of the disclosed principles.

Figure 2D:
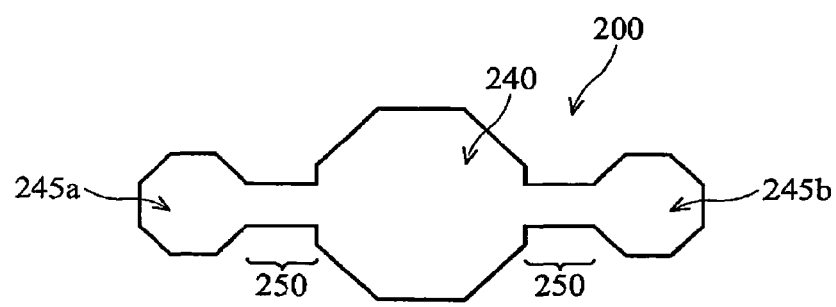

With reference now to FIG. 2D, illustrated is a top view of the solder bump area 200 after solder material has been deposited. After the patterning and developing of the photoresist layer 225 done with reference to FIG. 2C, solder material is deposited in the primary and secondary solder molds 230, 235a, 235b. Although any appropriate technique may be employed, exemplary embodiments of the disclosed process employs a vapor deposition process or electroplating to deposit the solder material. In addition, any appropriate type of solder material, including alloys of different metals, may be used as the solder material. Examples of solder materials includes, but are not limited to, lead, gold, silver, copper, and tin. In some specific embodiments, the solder material comprises over 90% lead, however this is not required. Embodiments with lead-based alloys may also be eutectic to assist in the reflow process, but again this is not required.

After the solder material is deposited, the photoresist layer 225 is removed from the solder bump area 200. Once the photoresist layer 225 is removed, a primary solder column 240 remains where the primary solder mold 230 was filled with solder material, while secondary solder columns 245a, 245b are present where the secondary solder molds 235a, 235b were filled. Moreover, the primary solder column 240 is also substantially larger than the secondary solder columns 245a, 245b, for example, where the secondary columns 245a, 245b have a volume of solder material anywhere between about 10% to 90% of the volume of the primary column 240. In addition, solder joining regions 250 are also present now in the solder bump area 200 where solder material filled openings in the photoresist layer 225 that adjoined the primary solder mold 230 and the secondary solder molds 235a, 235b. Typically, these joining regions 250 are substantially smaller in overall size and volume than either the primary or secondary solder molds 230, 235a, 235b. In other embodiments, the secondary solder columns 245a, 245b simply adjoin directly to the primary solder column 240. Moreover, the solder columns 240, 245a, 245b shown in FIG. 2D are octagonal shaped, corresponding to the octagonal shape of the solder molds 230, 235a, 235b in the photoresist layer 225, but any other corresponding shapes are possible.

Figure 2E:
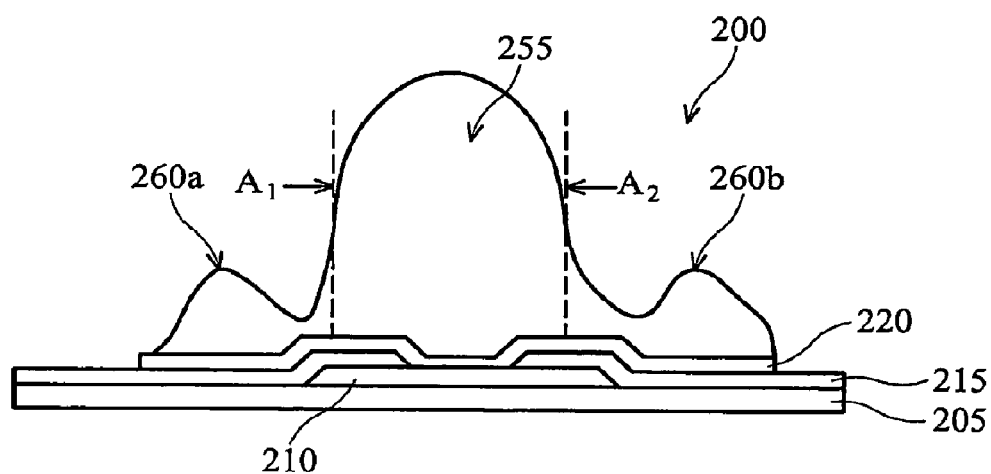

Looking now at FIG. 2E, illustrated is the solder bump area 200 after a reflow process used to form the final shape of the solder bump. Specifically, the entire assembly, typically having dozens if not hundreds of solder bump areas, is heated to a point where the solder columns 240, 245a, 245b melt. During the reflow process, the primary solder column 240 melts into the primary solder bump 255, which typically has a spherical shape around its upper half. In addition to the creation of the primary solder bump 255, secondary solder bumps 260a, 260b are also created adjacent to, and adjoined with, the primary solder bump 255 at the nadir defining the base perimeter of the primary solder bump 255. Furthermore, in accordance with the principles disclosed herein, adjoining of the solder columns 245a, 245b along side the primary column 240 results in cohesion between these columns during the reflow process. As a result, solder material originally deposited as part of the secondary solder columns 245a, 245b moves towards and into the primary solder column 240 during reflow, as indicated by arrows $A_1$ and $A_2$, thus increasing the volume of the primary solder bump 255 with solder material flowed from the secondary solder columns 245a, 245b.

Thus, as all the solder material melts and then is allowed to cool and re-harden during the reflow process to form the finished solder bumps 255, 260a, 260b, the solder material added to the primary bump 255 from the secondary bumps 260a, 260b increases the overall volume and size of the primary solder bump 255 such that it is larger than it would have been had only the primary solder column 240 been formed (as is done in the prior art). Therefore, the size of the finished primary solder bump 255 is larger than it would have been if made using only conventional techniques. Additionally, the height of the primary solder bump 255 is substantially taller than the height of each of the secondary solder bumps 260a, 260b not only because of the original size of the solder columns, but also because of the movement of material towards the primary solder bump 255 through cohesion. In many embodiments, the height of each of the secondary solder bumps 260a, 260b is about 10% to 90% of the height of the primary solder bump 255, but no specific height ratio is required. Specifically, the volume of the solder material in the primary solder bump 255 and/or its height is sufficient to electrically and mechanically couple the bonding pad 210 of the first substrate 205 to another, corresponding bonding pad of a second substrate, and the volume of solder material of each of the at least one secondary solder bumps 260a, 260b is not sufficient and does not reach height enough to contact the second substrate. This is especially beneficial in bonding techniques such as flip-chip techniques. Furthermore, although two secondary solder bumps 260a, 260b (and two secondary solder columns 245a, 245b) have been illustrated, the process disclosed herein is not limited to any particular number of secondary columns or bumps, and therefore as few as one may be employed.

Figure 2F:
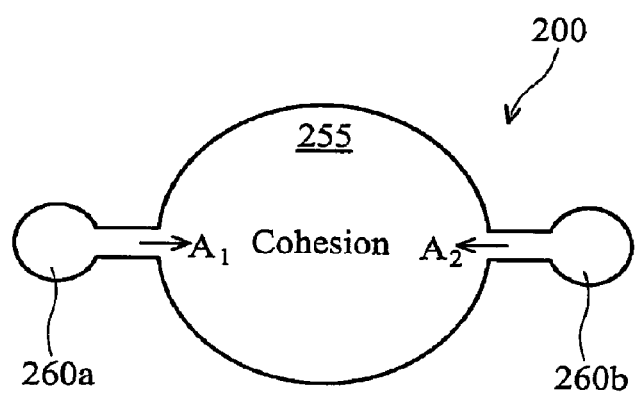

Turning finally to FIG. 2F, illustrated is a top view of a finished solder bump area 200 constructed using the principles and processes set forth in this disclosure. This view further demonstrates the spherical shape taken by both the primary and secondary solder bumps 255, 260a, 260b after the reflow process. In addition, the direction of the cohesion that occurs between the primary and secondary solder bumps 255, 260a, 260b is illustrated again using arrows $A_1$ and $A_2$. Moreover, the adjoining of the secondary solder bumps 260a, 260b to the primary solder bump 255 at its nadir is also shown.

While various embodiments of forming a unique solder bump for a semiconductor substrate according to the principles disclosed herein have been described above, it should be understood that they have been presented by way of example only, and not limitation. Thus, the breadth and scope of the invention(s) should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Brief Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An intermediate structure, comprising:
  a primary solder column comprising primary solder material formed in a column shape on a bonding pad area comprising a bonding pad on a semiconductor substrate, the primary solder column electrically contacting the bonding pad along a base defining an overall width of the primary solder column;
  at least one secondary solder column comprising secondary solder material formed in a column shape on the bonding pad area distinct from the primary solder column, the at least one secondary solder column electrically contacting the bonding pad along a base defining an overall width of the at least one secondary solder column, and having a substantially similar column shape to the primary solder column but with a height, width and volume less than a height, width and volume of the primary solder column;
  a joining channel, formed on the bonding pad, physically and electrically connecting an exterior sidewall of the secondary solder column at one end of the channel with an exterior sidewall of the primary solder column at the opposite end of the channel so that the secondary column is horizontally adjacent to the primary solder column along the bonding pad, the joining channel having a width, measured along the channel, and a volume less than the overall width and volume of the secondary solder column; and
  wherein the primary solder column is further configured to form a primary solder bump comprising the primary solder material and at least a portion of the secondary solder material and the joining solder material through cohesion from the at least one secondary solder column when the intermediate structure undergoes a reflow process.

2. The intermediate structure according to claim 1, wherein a volume of the primary solder column is larger than a volume of each of the at least one secondary solder columns.

3. The intermediate structure according to claim 2, wherein the volume of each of the at least one secondary solder columns is about 10% to 90% of the volume of the primary column.

4. The intermediate structure according to claim 1, wherein a width of the primary solder column is substantially equal to a width of the bonding pad.

5. The intermediate structure according to claim 1, further comprising a passivation layer formed over the bonding pad, wherein the primary solder column electrically contacting the bonding pad comprises the primary solder column electrically contacting the bonding pad through an opening formed in the passivation layer.

6. The intermediate structure according to claim 1, further comprising an under-bump metallization (UBM) layer over the bonding pad, wherein the primary and at least one secondary solder columns are in electrical contact with the bonding pad via the UBM layer.

7. The intermediate structure according to claim 6, wherein the UBM layer is titanium.

8. The intermediate structure according to claim 1, wherein the solder material comprises one or more materials selected from the group consisting of lead, gold, silver, tin, and copper.

9. A solder bump structure formed on a bonding pad of a first substrate, the structure comprising:
  a primary solder bump comprising a volume of solder material having a first height and a base, defining an overall width of the primary solder bump, formed on a bonding pad area and electrically contacting the bonding pad;
  at least one secondary solder bump comprising a volume of solder material having a second height less than the first height, the secondary solder bump having a base, defining an overall width of the at least one secondary solder bump less than the width of the primary solder bump, formed on the bonding pad area distinct from the primary solder column, the at least one secondary solder bump having a shape substantially similar to the shape of the primary solder bump but smaller in volume; and
  a joining channel, formed on the bonding pad, physically and electrically connecting an exterior sidewall of the secondary solder bump at one end of the channel to an exterior sidewall of the primary solder bump at the opposite end of the channel such that the secondary solder bump is horizontally adjacent to the primary solder bump along the bonding pad and metallurgically adjoined thereto at the base, wherein the joining channel has a width measured along the channel and volume less than the overall width and volume of the secondary solder bump.

10. The structure according to claim 9, wherein the volume of secondary solder bump material is less than the volume of the primary solder bump material.

11. The structure according to claim 10, wherein the metallurgical bond of the first substrate to the second substrate is a flip-chip bonding technique.

12. The structure according to claim 10, wherein the volume of solder material in the joining channel is less than the volume of the secondary solder bump.

13. The structure according to claim 10, wherein the volume of each of the at least one secondary solder bumps is about 10% to 90% of the volume of the primary bump.

14. The structure according to claim 9, wherein the first height is sufficient to metallurgically bond the primary solder bump to the bonding pad of the second substrate and the second height is not sufficient.

15. The structure according to claim 14, wherein the second height is about 10% to 90% of the height of the primary solder bump.

16. The structure according to claim 14, wherein the metallurgical bond of the first substrate to the second substrate is a flip-chip bonding technique.

17. The structure according to claim 9, wherein at least a portion of solder material comprising the primary solder bump originated from the at least one secondary solder bump through cohesion during a reflow process performed on the solder bump structure.

18. The structure according to claim 9, wherein a width of the primary solder bump is substantially equal to a width of the bonding pad.

19. The structure according to claim 9, wherein the solder material comprises one or more materials selected from the group consisting of lead, gold, silver, tin, and copper.

20. The structure according to claim 9, wherein the base of the primary solder bump is defined by a nadir, and wherein the secondary solder bump is metallurgically adjoined to the primary solder bump at the nadir.

* * * * *